ELECTRIC BUILDING BLOCKS

Filed Nov. 10, 1958

ROBERT D. MELCHER
ROBERT B. JACKSON
INVENTORS.

BY Beehler & Shanahan
ATTORNEYS.

United States Patent Office 3,005,131

Patented Oct. 17, 1961

3,005,131

ELECTRIC BUILDING BLOCKS

Robert D. Melcher, 3540 Carmona Ave., Los Angeles 16, Calif., and Robert B. Jackson, 2440 Marion, Anaheim, Calif.

Filed Nov. 10, 1958, Ser. No. 772,813
2 Claims. (Cl. 317—101)

The invention relates to a means for building electronic circuits and has particular reference to a series of units of uniform character and design such that they can be connected together both laterally and vertically in order to build up an electronic or electric circuit in accordance with some preconceived design.

More particularly the invention relates to a series of uniformly shaped and sized blocks of plastic or other insulating material equipped with means for mounting electronic components therein and provided with a multiplicity of connections on all sides so that the blocks and contained units can be interconnected with other blocks to work out a circuit.

In the electric and electronic arts when a circuit involving sundry electronic components is to be tried, the expedient most commonly resorted to has been to build a bread-board circuit. By this is meant that a large surface of some appropriate insulating material is used as a mounting board and the entire circuit worked out in two dimensions on the board, either by mounting the components and interconnecting them with wires or on occasions preparing a printed circuit by use of metallic ink to serve as the interconnecting wires and soldering the component at appropriate locations in the printed circuit. Circuits of the kind here under consideration may include a great variety of components as, for example, inductances, resistors, capacitors, tubes of either miniature or subminiature type, transistors, relays, and other conventional and appropriate components.

Although the bread-board type of circuit serves an important purpose in that it spreads out all of the wiring and components in a manner making them readily visible, it has certain disadvantages in that if the circuitry is not put together in the first instance in a proper or desired manner or if experimentation be needed, it becomes tedious and difficult to remove the components by unsoldering the connections, thereafter to replace them with different components or to place the same components at different locations in the circuit. The wiring also is somewhat difficult to change in printed circuits where some rewiring might be needed in order to accommodate a new arrangement.

Also when bread-board circuits are employed for teaching the design of an electronic circuit to do some specified work, the two-dimensional arrangement is somewhat unrealistic and fails to convey an accurate impression of what the ultimate arrangement will probably be when the circuit is housed in a suitable cabinet wherein it is compacted and mounted in a three-dimensional rather than a two-dimensional arrangement.

It is therefore among the objects of the invention to provide a new and improved means for constructing electronic circuits in three dimensions.

Another object of the invention is to provide a new and improved set of units of uniform size and shape capable of containing electronic components and possessed of a multiplicity of connections arranged in such fashion that any unit can be connected to any other unit in the system with a releasable type connection so that when the units need to be rearranged and replaced, they can be readily disconnected without the necessity of any breaking of a soldered joint and reconnected by use of the same type of releasable joint.

Still another object of the invention is to provide a new and improved device for the building up of electronic circuits wherein individual units of substantially uniform size and shape are arranged to be separable into complementary parts whereby components can be mounted therein and connections from the components secured alternatively to a variety of releasable connections in a fashion such that should it be necessary to remove and replace the component, the connections can be readily broken and then remade in either the same or some different direction, depending upon the ultimate needs of the built-up circuit.

Still another object of the invention is to provide a new and improved device for the building up and rebuilding of electronic circuits which is of such character that it is physically held together in final form without the necessity for providing some anchoring or supporting surface and which further contains a multiplicity of connections in virtually all directions so that units can be by-passed if need be or, in the alternative, connected in any desired direction, the construction of the individual units furthermore being of sufficiently open character to permit a ready circulation of air through and between the units when in assembled form, thereby to avoid the prospect of overheating any portions of the circuit when the circuit is operated.

With these and other objects in view, the invention consists in the construction, arrangement and combination of the various parts of the device whereby the objects contemplated are attained, as hereinafter set forth, pointed out in the appended claims and illustrated in the accompanying drawings.

Figures 1, 2, 3, 4:
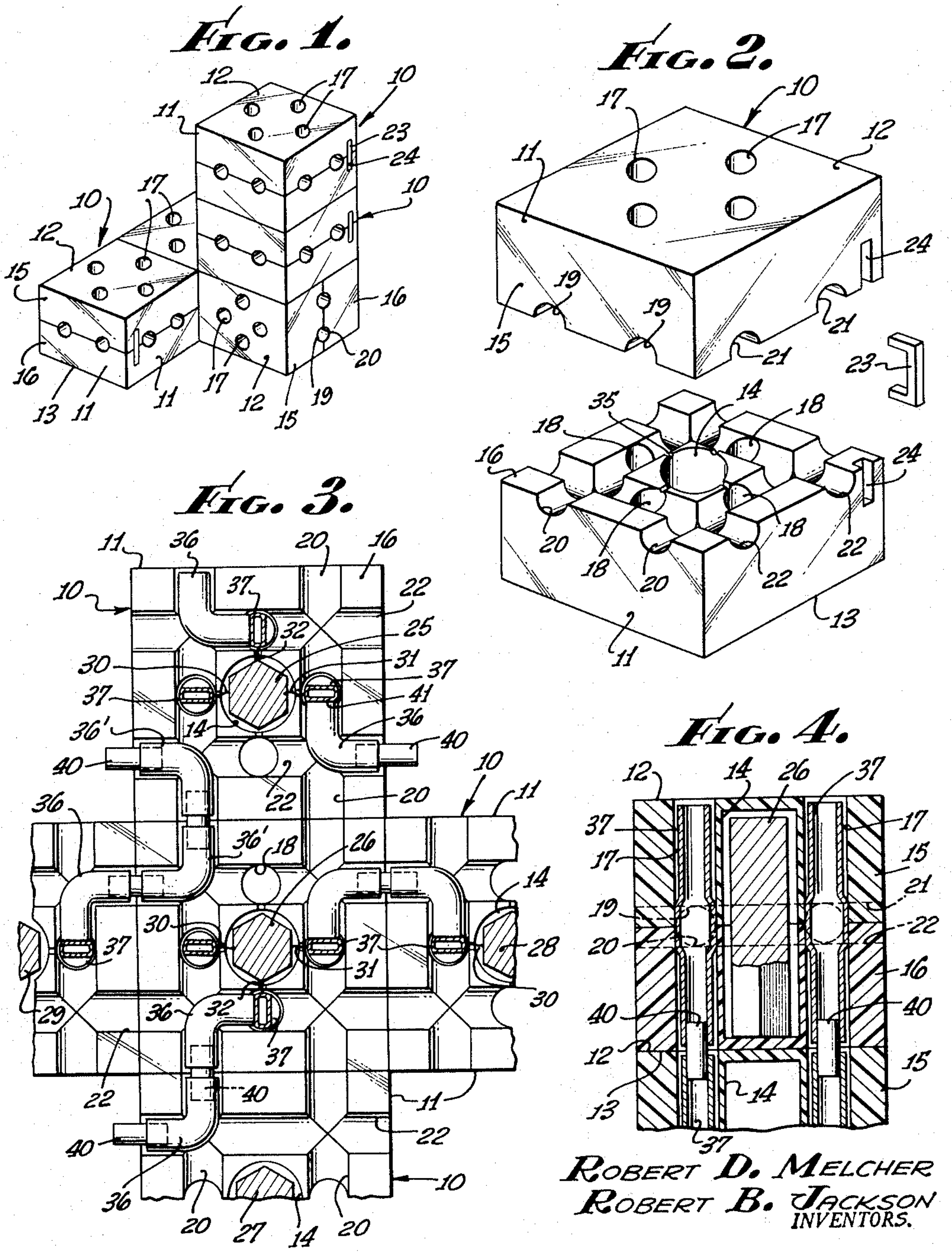
FIGURE 1 is a perspective view of a typical fragmentary arrangement of units in three-dimension suggestive of how the units can be employed to build up a circuit.
FIGURE 2 is a perspective exploded view of one of the units showing portions of the internal construction.
FIGURE 3 is a transverse view showing the arrangements of individual units in two-dimension with upper parts of the units removed in order to reveal the interior connection.
FIGURE 4 is a fragmentary vertical sectional view showing the manner in which adjacent units are interconnected in a vertical direction.

In an embodiment of the invention chosen for the purpose of illustration there is provided a series of blocks 10 here having a cubical form and presenting lateral or side faces 11, as shown in FIGURES 1 and 2, upper faces 12 and lower faces 13. The designation upper, lower and side faces should be understood, however, as for illustrative purposes only in that the blocks may be mounted on any of the side faces or upside down if need be.

The blocks as indicated are of uniform construction on both exterior and interior, each block consisting of an upper part 15 and a lower part 16. The blocks are complementary with respect to each other to such an extent that the upper and lower blocks may be identical.

In each part there is provided a cavity portion 14 which matches the cavity portion in the complementary part, this cavity being provided for the reception and mounting of an appropriate electronic component which may be any one of a great variety of components such as transistors, capacitors, resistors, tubes, condensers, and the like. The size of the cavity is such that it is large enough to accommodate the largest component expected to be used in the circuit, smaller components being also receivable in the cavity and secured by suitable means such as potting or other appropriate mounting expedients, or on occasion may be held merely by retention of the leads.

On the upper part 15 are apertures 17 which open through the face 12 and extend downwardly through the part. These apertures match apertures 18 in the lower part 16 which extend downwardly into communication with the lower faces 13.

Extending transversely within the upper part 15 are half sections 19 which match half sections 20 in the part 16 when the parts are assembled, thereby to provide apertures extending between opposite side faces 11.

In a direction at right angles thereto are half sections 21 in the upper part 15 matching half sections 22 in the lower part 16 which likewise provide apertures extending transversely between the other opposite side faces 11. It is important to note that all of the apertures are interconnected within the block and that the apertures 17, 18 pass directly through appropriate half sections forming the other apertures so that there is a complete and entire intercommunication of all of the apertures through the assembled block.

To appropriately tie together the upper and lower parts 15 and 16 in assembled position, some appropriate releasable tie may be provided such as U-shaped staples 23 countersunk in recesses 24 in order to be flush with the surface of the block.

As indicated, the cavities are receptive of electronic components 25, 26, 27, 28 and 29, as illustrated in FIGURE 3, wherein the components have been shown schematically. As already referred to, the components may consist of any of a great variety of electronic components in transistor form, in tube form or in other appropriate and conventional forms. By way of example transistors are made reference to and with respect to the component 25, lead contacts 30, 31 and 32 extend outwardly through appropriate notches 35 into one or another of the apertures heretofore made reference to where appropriate connections can be made to them. The lead contacts may be described as being secured to fixed contact points on the components.

In the chosen embodiment two types of contacts within the units are employed, namely, hollow bent tubular contacts 36 and straight tubular contacts 37. For convenience these contacts are as indicated in the form of hollow tubes of such external diameter that they fit snugly within appropriate portions of the apertures through the unit. The snug fit is needed in order that the contacts may be pressed into firm electrical contact with the lead contacts 30, 31, 32, as the case may be, in order to be certain of a positive electric connection. A pressure surface-to-surface engagement has been found to be sufficient in that it is an engagement which not only can be readily made but which can also be readily released.

The straight tubular contacts are likewise tubes with the same snug fit in order that they too may have a pressure connection with appropriate lead contacts.

It will be noted that the hollow bent tubular contacts which resemble pipe L's have both legs of the L's of equal length and of such length that the outermost length of the L is recessed slightly with respect to the adjacent surface of the unit so that there will be no prospect of a short circuit contact made. The straight tubular contacts are similarly recessed a short distance below the appropriate surface. To interconnect the tubular contacts there are provided cross-over connections 40 which may be solid or hollow pins which are of such diameter as to provide a snug sliding fit within the interior of the tubular contacts. The pins are all identical in length so that they can be interchanged indiscriminately between hollow bent tubular contacts and straight tubular contacts.

Further in the interest of providing for appropriate interconnections between tubular contacts, it will be noted that the straight tubular contact has indentations 41 at the midsection into which ends of the bent tubular contacts engage with a pressure surface-to-surface connection.

When in use the units are equipped with the appropriate components previously made reference to and for convenience may be marked by some convenient means, either by numbers, letters, or perhaps the tint or color of the material of the block.

When the units are to be assembled, as suggested in FIGURES 1, 2 and 4, in order to comprise a circuit, some acceptable wiring diagram may be employed or in the hands of skillful workmen the circuit may be built from the units without the aid of some visual guide. When adjacent units are to be interconnected electrically, the cross-over connections 40 will be inserted into adjacent tubular contacts, either bent contacts or straight contacts, depending on which are properly located. By this means the components of one block may be connected with suitable lead contacts with the components of adjacent blocks. On occasions, however, the components of a block may need to be by-passed, in which event a bent tubular contact such as the contact 36′ of FIGURE 3 may pass through the unit without being interconnected with the component. On other occasions a straight tubular contact may pass entirely through the unit without it having an electric contact with the component housed therein. Two, three and four through tubular contacts may thus be employed to by-pass as many as need be of the units until a proper unit is reached where contact can be made. The connections and by-passing can be made indiscriminately in a vertical direction and a horizonal direction or by a combination of the two. As will be noted from FIGURE 1, units may be placed side-wise so that what has been designated as upper and lower faces may become side faces, inasmuch as spacings between apertures are kept uniform, thereby making interconnection possible between all faces.

On those occasions where a unit may be improperly placed or may need to have a unit of different power or characteristics substituted therefor, a sufficient number of units can be readily disconnected in the vicinity of the desired exchange and a new unit placed therein and the surrounding units replaced. Since only slip-fit cross-over connections are used, no unsoldering and resoldering is necessary.

Still further, when it appears that a unit does not contain a proper component or if the contacts of the component are improperly located, the parts 15 and 16 may be separated by removal first of the staples 23, after which the component can be extracted from the cavity 14 after loosening the contacts from their pressure engagement with the tubular contacts and a new component inserted. The contacts of the new component can then be laid beneath the appropriate tubular contacts and when the parts are replaced and locked by use of the staples 23, the entire unit can be replaced into the circuit system.

From the foregoing description it will be understood how a circuit can be built up in three dimensions and in fact, if need be, can be built up in separate three dimensional units and the three dimensional units interconnected in the same general fashion. The building up is a material assistance in visually understanding how the components can be interconnected both from the point of view of teaching students and from the point of view of experimental circuitry where new results are being tested. By reason of the physical and mechanical interconnection of parts, the three-dimensional built up circuitry block can be held intact and moved about readily from place to place as need may arise.

While we have herein shown and described our invention in what we have conceived to be the most practical and preferred embodiment, it is recognized that departures may be made therefrom within the scope of our invention, which is not to be limited to the details disclosed herein but is to be accorded the full scope of the claims so as to embrace any and all equivalent devices.

Having thus described our invention, what we claim as new and desire to secure by Letters Patent is:

1. A mechanical system for assembling electronic circuits comprising a plurality of blocks of electrically nonconductive material, said blocks being identical in size and shape and each being of prism configuration of square cross-section having four side faces and two opposite end faces, the end faces being perpendicular to the side faces whereby the blocks are adapted to be placed in a compact three-dimensional arrangement in face-to-face abutment respectively, and with the abutment areas being coextensive with the areas of the faces which are in abutment respectively, each block having inside walls defining an internal central cavity for housing an electronic component, each block having a plurality of apertures formed therein, each aperture having two ends which open in the block faces, each aperture extending adjacent and being open to said cavity, tubular electrical contact elements disposed in the apertures respectively and extending from end to end of said elements to adjacent the end openings of the apertures respectively, each block face having at least two aperture end openings, certain of said tubular contact elements being angular for extending from adjacent an aperture end opening of one face of a block to an aperture end opening in an adjacent face of the block, others of said tubular contact elements being straight for extending to adjacent aperture end openings in antipodal faces of the block, the ends of said contact elements being spaced inwardly of the planes of their adjacent block faces whereby said elements do not project outwardly of the blocks, the end openings of the apertures being disposed within the perimeters of their block faces at predetermined positions for alignment with end openings respectively in abutting blocks, and cross-over electrical contact pins slidable tight into said tubular contact elements for releasably interconnecting the contacts of one block with the contacts of other blocks respectively and which other blocks are disposed in face-to-face abutment with said one block.

2. A mechanical system according to claim 1 in which said prism configuration is a cube.

References Cited in the file of this patent

UNITED STATES PATENTS

| | | |
|---|---|---|
| 2,293,911 | Morten | Aug. 25, 1942 |
| 2,783,416 | Butler | Feb. 26, 1957 |
| 2,947,914 | Simons | Aug. 2, 1960 |

FOREIGN PATENTS

| | | |
|---|---|---|
| 144,122 | Switzerland | Mar. 2, 1931 |
| 129,601 | Australia | Oct. 25, 1948 |

OTHER REFERENCES

Radio-Craft for January 1939; pages 400, 401 and 431.